United States Patent [19]
Shin et al.

[11] Patent Number: 5,344,796
[45] Date of Patent: Sep. 6, 1994

[54] METHOD FOR MAKING POLYCRYSTALLINE SILICON THIN FILM

[75] Inventors: Jong Y. Shin; Suk B. Ma, both of Seoul, Rep. of Korea

[73] Assignee: Samsung Electronics Co., Ltd., Kyungki-Do, Rep. of Korea

[21] Appl. No.: 998,665

[22] Filed: Dec. 30, 1992

[30] Foreign Application Priority Data

Oct. 19, 1992 [KR] Rep. of Korea ............ 19207
Oct. 19, 1992 [KR] Rep. of Korea ............ 19208

[51] Int. Cl.$^5$ ............................................. C30B 29/06
[52] U.S. Cl. ................................... 437/233; 117/43
[58] Field of Search ............... 156/603, 612, DIG. 64, 156/DIG. 73; 427/452; 437/101, 109, 233, 963

[56] References Cited

U.S. PATENT DOCUMENTS

| | | | |
|---|---|---|---|
| 4,180,618 | 12/1979 | Alpha et al. | 156/DIG. 64 |
| 4,851,363 | 7/1989 | Troxell et al. | 437/40 |
| 5,064,779 | 11/1991 | Hasegawa | 437/109 |

Primary Examiner—R. Bruce Breneman
Assistant Examiner—Felisa Garrett
Attorney, Agent, or Firm—Cushman, Darby & Cushman

[57] ABSTRACT

A method for making a polycrystalline silicon thin film by crystallizing an amorphous silicon thin film at a low temperature of 500° C. to 600° C. Over a glass substrate is deposited a microcrystalline silicon seed layer having a thickness of 100 Å to 500 Å, using the chemical vapor deposition method. Over the microcrystalline silicon seed layer, a hydrogen-containing amorphous silicon layer is formed by chemical vapor deposition, at a temperature of 180° C. to 270° C., which is then crystallized to form a polycrystalline silicon thin film. A hydrogen-containing amorphous silicon layer having a thickness of 300 Å to 500 Å may be formed over the glass substrate. In this case, the hydrogen-containing amorphous silicon layer is crystallized at a temperature of 600° C., to form a polycrystaline seed layer. Over the polycrystalline silicon seed layer, another hydrogen-containing amorphous silicon layer is formed which is then crystallized by a heat treatment, to form a polycrystalline thin film. The heat treatment is carried out at a temperature of 580° C. to 600° C. for a period of 20 hours to 50 hours.

6 Claims, 2 Drawing Sheets

METHOD FOR MAKING POLYCRYSTALLINE SILICON THIN FILM

BACKGROUND OF THE INVENTION

1. Field of the Invention

The present invention relates to a method for making a polycrystalline silicon thin film, and more particularly to a method for making a polycrystalline silicon thin film by crystallizing an amorphous silicon thin film at a low temperature.

2. Description of the Prior Art

Recently, polycrystalline silicon (p-Si) thin films have been used for p-Si TFT liquid crystal displays (LCDs) and contact image sensors (CISs), in dynamic random access memory (DRAM) and display fields. A method which are currently used in making such p-Si thin films comprises heat treating an amorphous silicon (a-Si) thin film or a microcrystalline silicon ($\mu$-Si) thin film at a high temperature of about 1,000° C. A p-Si thin film produced according to this method exhibits a superior characteristic, but encounters a phenomenon that its substrate is wraped and shrunk due to the heat treatment at the high temperature. As a result, the method undesirably requires the use of expensive substrates made of a single crystal silicon (c-Si) or a quartz. In particular, the phenomenon becomes more severe at a larger thickness of the thin film. In severe cases, alignment of pattern as a subsequent process cannot be carried out.

To solve these problems, there have been proposed techniques for crystallizing an a-Si thin film to form an p-Si thin film at a low temperature of not more than 600° C. According to these techniques, a glass substrate can be used for making the p-Si thin film, so that the manufacture becomes inexpensive.

As such low temperature crystallization techniques, there are three methods, that is, a solid phase crystallization (SPC) method, a rapid thermal annealing (RTA or RTP) method and a laser annealing (LA) method.

The SPC method has an advantage that an a-Si thin film of a large area can be easily uniformly crystallized to form a p-Si thin film, However, it requires a heat treatment at about 600° C. for a long period of 24 hours to 72 hours, Due to such a long crystallization period, the glass substrate which has a deformation temperature of about 580° C. is likely to be wraped and shrunk, Such a wraping phenomenon may be greatly exhibited, depending on materials deposited over the substrate and their deposition thicknesses. in cases of making TFT devices using a semiconductor integration process, this phenomenon also causes a problem in a pattern alignment. Consequently, it serves as a factor causing a degradation or loss in characteristics of the element finally obtained. The long crystallization period results in a decrease in productivity and an increase in a possibility that impurities contained in the glass substrate will penetrate the p-Si thin film formed over the glass substrate.

The RTA method is a process enabling a crystallization within a short period of several seconds to several minutes, as compared with the SPC method. However, this method encounters a problem in maintaining a constant temperature and a substrate deformation caused by a high temperature exposure.

On the other hand, the LA method has an advantage that a p-Si thin film exhibiting a high drift mobility can be made within a short period. However, this method has a problem in obtaining a uniform crystallization, since the crystallized area obtained at one crystallization is small.

As apparent from the above description, all conventional low temperature crystallization methods have respective severe problems. Accordingly, a new method capable of solving the problems encountered in the conventional methods is required.

SUMMARY OF THE INVENTION

Therefore, an object of the invention is to solve the above-mentioned problems encountered in the prior arts and to provide a method for making a polycrystalline silicon thin film capable of maintaining a uniformity in crystallization at a large area as in the conventional SPC method and lowering the upper limit of the crystallization temperature, thereby preventing shrinking and bending phenomenons of a glass substrate, reducing the crystallization period, producing a polycrystalline silicon thin film exhibiting a high drift mobility.

In accordance with one aspect, the present invention provides a method for making a polycrystalline silicon thin film comprising the steps of: preparing a glass substrate; forming a microcrystalline silicon layer as a seed layer over the glass substrate; forming a hydrogen-containing amorphous silicon layer over the microcrystalline silicon seed layer; and heat treating the hydrogen-containing amorphous silicon layer, to form a polycrystalline silicon thin film.

The microcrystalline silicon seed layer formed over the glass substrate has a thickness of 100 Å to 500 Å.

The hydrogen-containing amorphous silicon layer has a thickness of not more than 1,000 Å and is crystallized at a temperature of 580° C. to 600° C. for a period of 20 hours to 50 hours at the heat treating step thereof, to form the polycrystalline silicon thin film.

In accordance with another aspect, the present invention provides a method for making a polycrystalline silicon thin film comprising the steps of: preparing a glass substrate; forming a hydrogen-containing amorphous silicon layer over the glass substrate; heat treating the hydrogen-containing amorphous silicon layer, to form a polycrystalline silicon layer as a seed layer; forming another hydrogen-containing amorphous silicon layer over the polycrystalline silicon seed layer; and heat treating the another other hydrogen-containing amorphous silicon layer, to form a polycrystalline silicon thin film.

The hydrogen-containing amorphous silicon layer formed over the glass substrate has a thickness of 300 Å to 600 Å and is crystallized at a temperature of 600° C. at the heat treating step thereof, to form the polycrystalline silicon seed layer.

The another other hydrogen-containing amorphous silicon layer has a thickness of not more than 1,000 Å and is crystallized at a temperature of 580° C. to 600° C. for a period of 20 hours to 50 hours at the heat treating step thereof, to form the polycrystalline silicon thin film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 1, 2A to 2C and FIGS. 3A to 3D, there are illustrated methods for making p-Si thin films in accordance with two embodiments of the present invention, respectively.

Figure 1A:
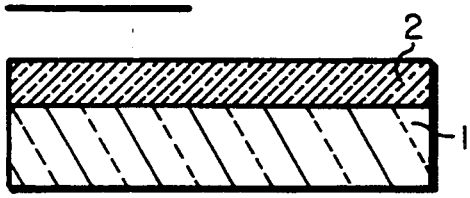
FIG. 1A is a schematic sectional view illustrating a hydrogen-containing amorphous silicon layer formed over a substrate and not subjected to a crystallization treatment yet, in accordance with the prior art.
Figure 1B:
FIG. 1B is a schematic sectional view illustrating a p-Si thin film formed over the substrate by the crystallization of the a-Si layer, in accordance with the prior art.
Figure 2A:
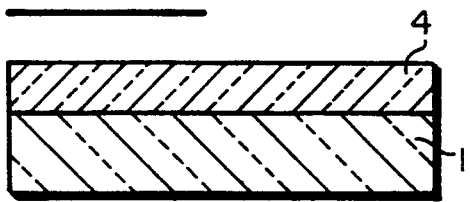
FIG. 2A is a schematic sectional view illustrating a μ-Si layer as a seed layer over a substrate, in accordance with a first embodiment of the present invention.
Figure 2B:
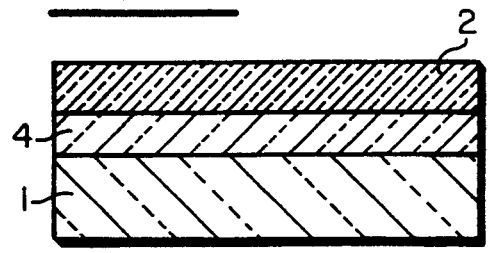
FIG. 2B is a schematic sectional view illustrating an a-Si:H layer deposited over the p-Si seed layer shown in FIG. 2A, in accordance with the first embodiment of the present invention.
Figure 2C:
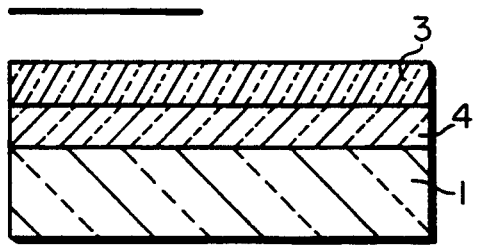
FIG. 2C is a schematic sectional view illustrating a p-Si thin film formed over the substrate by the crystallization of the a-Si:H layer, in accordance with the first embodiment of the present invention.

In accordance with the first embodiment illustrated in FIGS. 2A to 2C, over a glass substrate 1 is deposited a μ-Si seed layer 4 having a thickness of 100 Å to 500 Å, using the chemical vapor deposition (CVD) method. Over the μ-Si seed layer 4, an a-Si:H layer 2' is formed which is then crystallized to form a p-Si layer 3.

In accordance with the second embodiment illustrated in FIGS. 3A to 3D, over a glass substrate 1 is deposited an a-Si:H layer 2 having a thickness of 300 Å to 500 Å. The a-Si:H layer 2 is then crystallized at a temperature of 600° C., to form a p-Si seed layer 4'. Over the p-Si seed layer 4', another a-Si:H layer 2' is formed which is then crystallized by a heat treatment, to form a p-Si layer 3'.

First, the low temperature crystallization method of the first embodiment using the μ-Si thin film as a seed layer will be described in detail.

In accordance with the method, first, the glass substrate 1, which is finely ground and has a deformation temperature of about 600° C. is cleaned using a detergent containing hydrofluoric acid and an organic solvent, Over the glass substrate 1, the μ-Si seed layer 4 is deposited according to the CVD method, to have a thickness of 100 Å to 500 Å, as shown in FIG, 2A. This deposition of ∥-Si seed layer is carried out under a high power condition obtained from an a-Si solar battery, That is, the deposition is performed using a raw gas containing 20% of $SiH_4$, a base pressure of not more than $2 \times 10^{-6}$ torrs and a power density of several $mW/cm^2$.

When the μ-Si seed layer 4 has the thickness of less than 100 Å, the grain size of seed becomes undesirably small. At the thickness of more than 500 Å, there is a problem in manufacturing final elements and obtaining desired characteristics, even though the grain size of seed becomes large.

Thereafter, an a-Si:H layer 2 having a thickness of not more than 1,000 Å is grown over the μ-Si seed layer 4 using the CVD method, under the condition that the substrate 1 is maintained at a temperature of 180° C. to 270° C., as shown in FIG. 2B. The reason why the substrate temperature is maintained at the above-mentioned level is to obtain the best polycrystalline characteristics after the heat treatment.

Finally, the a-Si:H layer 2 is crystallized at a nitrogen atmosphere and a temperature of 580° C. to 600° C. for 20 hours to 50 hours, to form a p-Si layer 3, as shown in FIG. 2C.

Now, the low temperature crystallization method of the second embodiment using the μ-Si thin film as a seed layer will be described in detail.

Figure 3A:
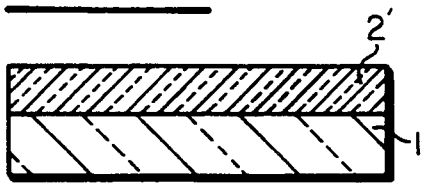
FIG. 3A is a schematic sectional view illustrating an a-Si:H layer formed over a substrate and not subjected to a crystallization treatment yet, in accordance with a second embodiment of the present invention.

In accordance with the second method, first, the glass substrate 1 finely ground and having a deformation temperature of about 600° C. is cleaned by a detergent containing a hydrofluoric acid and an organic solvent. Over the glass substrate 1, the a-Si:H layer 2' is deposited according to the CVD method, to have a thickness of 300 Å to 500 Å, as shown in FIG. 3A.

When the a-Si:H layer 2' has the thickness of less than 300 Å, the grain size of seed becomes undesirably small. At the thickness of more than 500 Å, there is a problem in manufacturing final elements and obtaining desired characteristics, even though the grain size of seed becomes large.

Figure 3B:
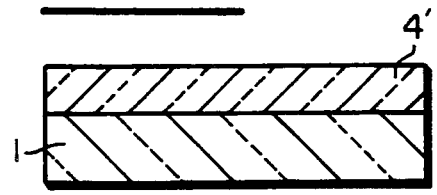
FIG. 3B is a schematic sectional view illustrating a p-Si thin film as a seed layer formed over the substrate by the crystallization of the a-Si:H layer, in accordance with the second embodiment of the present invention.

Thereafter, the a-Si:H layer 2' is crystallized at a temperature of 600° C., to form a p-Si seed layer 4', as shown in FIG. 3B. Although the crystallization temperature is 600° C., no bending occurs at the glass substrate 1. This is because the thickness of layer is small.

Figure 3C:
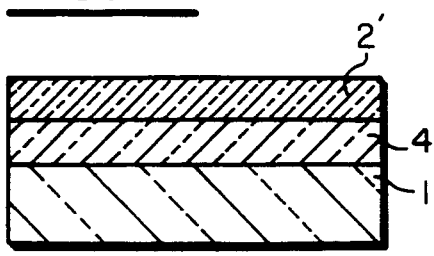
FIG. 3C is a schematic sectional view illustrating another a-Si:H layer deposited over the p-Si seed layer shown in FIG. 3B, in accordance with the second embodiment of the present invention.

Over the p-Si seed layer 4' another a-Si:H layer 2' having a thickness of not more than 1,000 Å is grown using the CVD method, under the condition that the substrate 1 is maintained at a temperature of 180° C. to 270° C., as shown in FIG. 3C, The reason why the substrate temperature is maintained at the above-mentioned level is to obtain the best polycrystalline characteristics after the heat treatment.

Figure 3D:
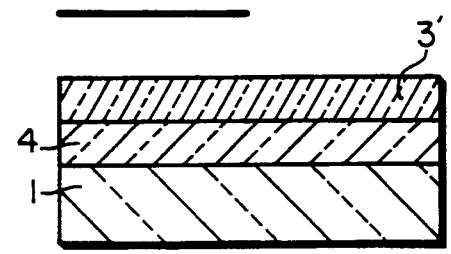
FIG. 3D is a schematic sectional view illustrating a p-Si thin film formed over the substrate by the crystallization of the a-Si:H layer shown in FIG. 3C, in accordance with the second embodiment of the present invention.

Finally, the another a-Si:H layer 2' is crystallized at a nitrogen atmosphere and a temperature of 580° C. to 600° C. for 20 hours to 50 hours, to form a p-Si layer 3', as shown in FIG. 3D.

The present invention will be understood more readily with reference to the following examples and comparative examples; however, these examples are intended to illustrate the invention and are not to be construed to limit the scope of the present invention.

EXAMPLE 1

First, a glass substrate which is finely ground and has a deformation temperature of about 600° C. was prepared and then cleaned by a diluted hydrofluoric acid. Over the glass substrate, a μ-Si seed layer was deposited according to the CVD method, to have a thickness of 300 Å. The deposition was performed using a raw gas containing 20% of SiH$_4$, a base pressure of $2\times10^{-6}$ torrs and a power density of 7 mW/cm$^2$ to 8 mW/cm$^2$. Thereafter, an a-Si:H layer having a thickness of 1,000 Å was deposited over the p-Si seed layer using the CVD method, under the condition of maintaining the substrate at a temperature of 200° C. The deposition was performed using a raw gas containing 100% of SiH$_4$, a base pressure of $2\times10^{-6}$ torrs and a power density of 30 mW/cm$^2$ to 50 mW/cm$^2$. Finally, the a-Si:H layer was crystallized at a nitrogen atmosphere and a temperature of 580° C. for 40 hours, to form a p-Si layer. The crystallization was achieved by pre-heating the a-Si:H layer at 500° C. for about 2 hours, heating the a-Si:H layer to a temperature of 580° C. to 600° C. at a rate of 5° C./min, maintaining the a-Si:H layer at the temperature for about 40 hours, and cooling the a-Si:H layer at a rate of 1° C./min.

Figure 4:
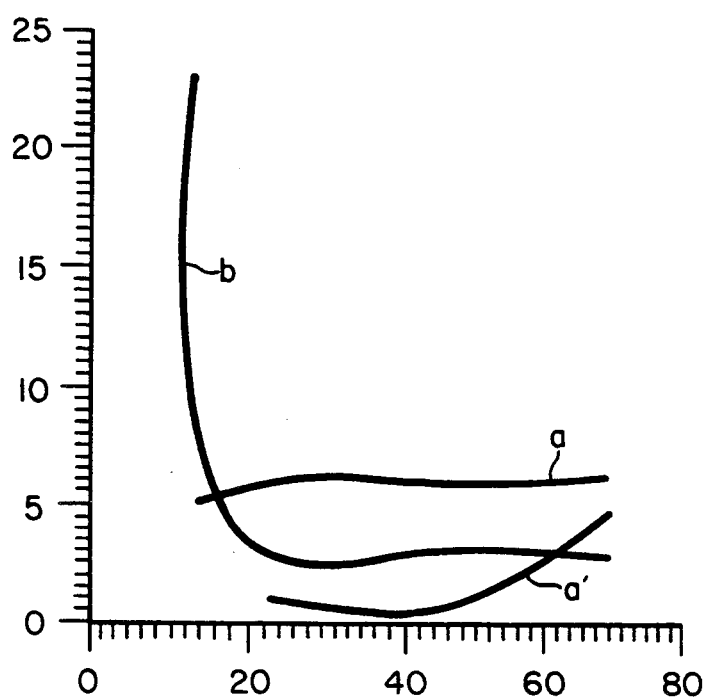
FIG. 4 and FIG. 5 are graphs illustrating variations in Raman shift deviation dependant on crystallization period, for Examples 1 and 2 of the present invention and Comparative Example.

For determining the crystallization period, the crystallization rate and the quality of obtained p-Si layer, a variation in Raman shift deviation dependant on crystallization period was measured upon the crystallization of the a-Si:H layer and its result is shown by graph a in FIG. 4. The peak intensity ratio dependant on the annealing period was also measured to find the crystallization rate. The result is shown by graph a in FIG. 5.

EXAMPLE 2

A glass substrate which is finely ground and has a deformation temperature of about 600° C. was prepared and then cleaned using hydrofluoric acid. Over the glass substrate, an a-Si:H layer was deposited according to the CVD method under the same condition as in Example 1, to have a thickness of 300 Å. Thereafter, the a-Si:H layer was crystallized by a heat treatment at a temperature of 600° C. for 40 hours, in the same manner as in Example 1, to form a p-Si seed layer. Over the p-Si seed layer, another a-Si:H layer having a thickness of 1,000 Å was deposited using the CVD method, under the condition of maintaining the substrate at a temperature of 200° C. Finally, the another a-Si:H layer was crystallized at a nitrogen atmosphere and a temperature of 580° C. for 40 hours, under the same condition as in Example 1, to form a p-Si layer.

For determining the crystallization period, the crystallization rate and the quality of obtained p-Si layer, a variation in Raman shift deviation dependant on crystallization period was measured upon the crystallization of the a-Si:H layer and its result is shown by graph a' in FIG. 4. The peak intensity ratio dependant on the annealing period was also measured to find the crystallization rate. The result is shown by graph a' in FIG. 5.

COMPARATIVE EXAMPLE 1

A glass substrate which is finely ground and has a deformation temperature of about 600° C. was prepared and then cleaned by a hydrofluoric acid. Over the glass substrate, an a-Si:H layer was deposited according to the CVD method, to have a thickness of 1,000 Å. The a-Si:H layer was then subjected to a heat treatment at a nitrogen atmosphere and a temperature of 600° C. for 65 hours, to form a p-Si layer.

For determining the crystallization period, the crystallization rate and the quality of obtained p-Si layer. a variation in Raman shift deviation dependant on crystallization period was measured upon the crystallization of the a-Si:H layer and its result is shown by graph b in FIG. 4. The peak intensity ratio dependant on the annealing period was also measured to find the crystallization rate. The result is shown by graph b in FIG. 5.

Figure 5:
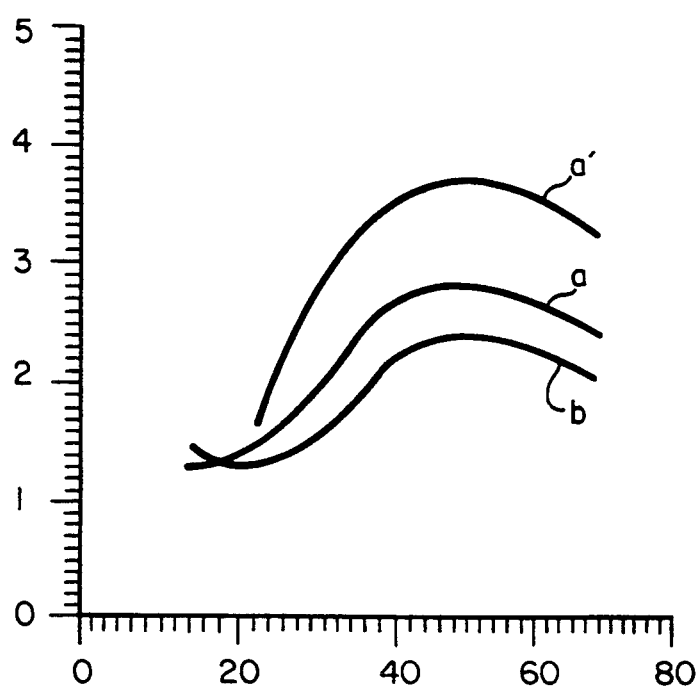

Referring to FIG. 4, it can be found that in the cases of using the μ-Si layer as the seed layer and using the a-Si layer for forming the p-Si layer as the seed layer, the crystallization rate at a low temperature is higher, as compared with the conventional case. It can be also found that in the cases according to the present invention, a saturated state is early achieved by about 10 hours, as compared with the conventional case. In the cases of the present invention, the variation in Raman shift deviation indicative of the quality of obtained p-Si thin film was very small, as compared with the conventional case. As shown in FIG. 5, the cases of the present invention, in particular, the case of Example 2 also exhibited an improvement in crystallization rate. The p-Si layer had the same size as that of the μ-Si seed layer and was grown in columnar direction from the seed layer. As a result, the p-Si layer had a grain size larger than that obtained by the conventional crystallization and grain boundaries at the minimum. That is, it can be found that the present invention produced a high quality of p-Si thin film with a high drift mobility. In accordance with the present invention, it was possible to decrease the crystallization temperature to 580° C. and reduce the crystallization period, thereby enabling the occurrence of the bending and shrinkage of glass substrate to be reduced. By virtue of the such an improvement in quality, field effect mobility of a thin film transistor subsequently obtained can be improved.

What is claimed is:

1. A method of making a polycrystalline silicon thin film comprising the steps of:
   preparing a glass substrate;
   forming a microcrystalline silicon layer as a seed layer over the glass substrate;
   forming a hydrogen-containing amorphous silicon layer over the microcrystalline silicon seed layer by chemical vapor deposition at a temperature in the range of 180° C. to 270° C.; and
   heat treating the hydrogen-containing amorphous silicon layer, to form a polycrystalline silicon thin film.

2. A method in accordance with claim 1, wherein the microcrystalline silicon seed layer formed over the glass substrate has a thickness of 100 Å to 500 Å.

3. A method in accordance with claim 1, wherein the hydrogen-containing amorphous silicon layer has a thickness of not more than 1,000 Å and is crystallized at a temperature of 580° C. to 600° C. for a period of 20 hours to 50 hours at a heat treating step thereof, to form the polycrystalline silicon thin film.

4. A method for making a polycrystalline silicon thin film comprising the steps of:
   preparing a glass substrate;
   forming a hydrogen-containing amorphous silicon layer over the glass substrate;
   heat treating the hydrogen-containing amorphous silicon layer, to form a polycrystalline silicon layer as a seed layer;
   forming another hydrogen-containing amorphous silicon layer over the polycrystalline silicon seed layer by chemical vapor deposition at a temperature in the range of 180° C. to 270° C.; and
   heat treating said other hydrogen-containing amorphous silicon layer, to form a polycrystalline silicon thin film.

5. A method in accordance with claim 4, wherein the hydrogen-containing amorphous silicon layer formed over the glass substrate has a thickness of 300 Å to 600 Å and is crystallized at a temperature of 600° C. at the heat treating step thereof, to form the polycrystalline silicon seed layer.

6. A method in accordance with claim 1, wherein the another hydrogen-containing amorphous silicon layer has a thickness of not more than 1,000 Å and is crystallized at a temperature of 580° C. to 600° C. for a period of 20 hours to 50 hours at the heat treating step thereof, to form the polycrystalline silicon thin film.

* * * * *